United States Patent [19]
Russell

[11] Patent Number: 6,111,776
[45] Date of Patent: Aug. 29, 2000

[54] COMPACT OPTICAL RANDOM ACCESS MEMORY HAVING MULTIPLE REFLECTIONS

[75] Inventor: James T. Russell, Bellevue, Wash.

[73] Assignee: Ioptics, Incorporated, Issaquah, Wash.

[21] Appl. No.: 09/141,335

[22] Filed: Aug. 27, 1998

Related U.S. Application Data

[63] Continuation-in-part of application No. 09/034,547, Mar. 3, 1998, which is a continuation-in-part of application No. 08/920,847, Aug. 29, 1997, which is a division of application No. 08/256,202, Jun. 28, 1994, Pat. No. 5,696,714, which is a continuation-in-part of application No. 07/815,924, Dec. 30, 1991, Pat. No. 5,379,266, and a continuation-in-part of application No. PCT/US97/07967, May 8, 1997
[60] Provisional application No. 60/017,502, May 10, 1996.
[51] Int. Cl.[7] .............................. G11C 11/42; G11C 13/04
[52] U.S. Cl. ......................... 365/124; 365/106; 365/120
[58] Field of Search ................................ 365/106, 120, 365/124, 127

[56] References Cited

U.S. PATENT DOCUMENTS 4,264,986   4/1981   Willis ....................................... 365/124

Primary Examiner—Terrell W. Fears
Attorney, Agent, or Firm—Charles J. Rupnick

[57] ABSTRACT

A compact optical memory is disclosed in which data are stored in an optical data layer capable of selectively altering light such as by changeable transmissivity, reflectivity, polarization, and/or phase. The data are illuminated by controllable light sources and an array of multi-surface diffractive imaging lenslets cause a data image to be projected onto an array of light sensors by multiple reflections of, hence folding the image rays, by surfaces that both reflect and optically modify the light rays to redirect them onto the sensor array. Data are organized into an annular array of patches (called pages). By selective illumination of each data page, one of the lenslets images the selected data page onto a central image plane where the sensor array is located. Light in the data image pattern strikes different ones of the arrayed light sensors, thereby outputting information in the form of electrical data signals.

20 Claims, 7 Drawing Sheets

COMPACT OPTICAL RANDOM ACCESS MEMORY HAVING MULTIPLE REFLECTIONS

CROSS REFERENCE TO RELATED PATENTS AND APPLICATIONS

This is a continuation-in-part of U.S. application Ser. No. 09/034,547 filed Mar. 3, 1998 which a continuation-in-part of U.S. application Ser. No. 08/920,847 filed Aug. 29, 1997 which is a division of Ser. No. 08/256,202 filed Jun. 28, 1994, now U.S. Pat. No. 5,696,714 which in turn is continuation-in-part of Ser. No. 07/815,924 filed Dec. 30, 1991, now U.S. Pat. No. 5,379,766 all by James T. Russell and also a continuation-in-part of international application PCT/US97/07967 filed May 8, 1997 which is a continuation-in-part of U.S. application Ser. No. 60/017,502 filed May 10, 1996 by Loren Laybourn, Richard E. Blahut and James T. Russell.

BACKGROUND OF THE INVENTION

The invention concerns method and apparatus of optically storing and retrieving digital data stored as light altering characteristics on an optical material and providing fast random access retrieval.

Optical memories of the type having large amounts of digital data stored by light modifying characteristics of a film or thin layer of material and accessed by optical addressing with minimal or no mechanical movement have been proposed but have not resulted in wide spread commercial application. The interest in such optical recording and retrieval technology is due to its faster retrieval of large amounts of data compared to that of existing electro-optical mechanisms such as optical discs, and magnetic storage such as tape and magnetic disc, all of which require relative motion of the storage medium.

For example, in the case of optical disc memories, it is necessary to spin the record and move a read head radially to retrieve the data, which is output in serial fashion. This type of data accessing not only requires the power consumption of the mechanical drives but also places more burden on buffer or other random access memory after retrieval in order to accommodate high speed data addressing and other data operations of modern computers. Solid state ROM and RAM can provide the relatively high access speeds that are sought, but the cost, size, and heat dissipation of such devices when expanded to relatively large data capacities limit their applications.

Examples of various other efforts to provide the relatively large capacity storage and fast access of an optical memory of the type that is the subject of this invention are disclosed in the patent literature such as U.S. Pat. No. 3,806,643 for PHOTOGRAPHIC RECORDS OF DIGITAL INFORMATION AND PLAYBACK SYSTEMS INCLUDING OPTICAL SCANNERS and U.S. Pat. No. 3,885,094 for OPTICAL SCANNER, both by James T. Russell; U.S. Pat. No. 3,898,005 for a HIGH DENSITY OPTICAL MEMORY MEANS EMPLOYING A MULTIPLE LENS ARRAY; U.S. Pat. No. 3,996,570 for OPTICAL MASS MEMORY; U.S. Pat. No. 3,656,120 for READ-ONLY MEMORY; U.S. Pat. No. 3,676,864 for OPTICAL MEMORY APPARATUS; U.S. Pat. No. 3,899,778 for MEANS EMPLOYING A MULTIPLE LENS ARRAY FOR READING FROM A HIGH DENSITY OPTICAL STORAGE; U.S. Pat. No. 3,765,749 for OPTICAL MEMORY STORAGE AND RETRIEVAL SYSTEM; and U.S. Pat. No. 4,663,738 for HIGH DENSITY BLOCK ORIENTED SOLID STATE OPTICAL MEMORIES. While some of these systems attempt to meet the above-mentioned objectives of the present invention, they fall short in one or more respects.

For example, some of the systems proposed above have lens or other optical structure not capable of the requisite resolution to retrieve useful data density. The optical resolution of the data image by these prior lens systems does not result in sufficient data density and data access rate to compete with other forms of memory. Although certain lens systems used in other fields such as microscope objectives are theoretically capable of the needed resolutions, such lens combinations are totally unsuited for reading data stored in closely spaced data fields. Another difficulty encountered with existing designs is the practical effect of temperature and other physical disturbances of the mechanical relationship between the data film or layer, the lens assemblies and the optical sensors that convert the optical data to electrical signals. For example, the thermal expansion effects of even moderate density optical memories of this type can cause severe misregistration between the optical data image and the read out sensors. Similar difficulties are encountered in the required registration between the recording process and the subsequent reading operations. Intervening misregistration of the high density optical components can cause significant data errors if not total loss of data.

A single reflection folded path optical memory device, such as disclosed in my U.S. Pat. No. 5,436,871, reduces somewhat the system dimension along the optical axis; the measurement that has been referred to as thickness or height of the optical memory device. But for very thin systems such as are required to fit inside a notebook computer, or even inside a still more compact PDA (Personal Digital Assistant), a new configuration is desired.

One function of the reflector in a folded path optical memory device is to perform the field, or collector, lens function of the system disclosed in application Ser. No. 08/920,847. The "collector" lens accepts an array of collimated beams, one from each data spot on a page of data, and directs each beam to, and focuses each beam on, the focal or target plane, i.e., the sensor array. It is similar to an astronomical telescope where the parabolic mirror accepts parallel ray bundles from an array of stars, and directs and focuses each star bundle on to the focal plane. If it is desired to reduce the thickness of the memory device, the focal length of the reflector must be reduced. But if it is desired to retain the same field of view such as for keeping the same data capacity, i.e., the same size data record, several problems arise.

First, the beams that are furthest off-axis will become astigmatic. This is a fundamental failing of a simple parabolic that is troublesome even in astronomical telescopes. Wide field telescopes require additional corrector elements.

Second, the angle that the off-axis beams make with the sensor plane may become so large that the image will be geometrically smeared, or may even approach the sensor from the rear; obviously an ineffective configuration. The solution for an astronomical instrument is to add an additional optical element, for example, a corrector plate some distance in front of the mirror. But in the folded path optical memory system, there is limited room for additional discrete elements, and the desired compression is much more severe than usually contemplated for astronomical instruments.

Accordingly, one object of this invention is to provide an optical mass memory having random accessibility in a relatively compact size, especially in height comparable to or even smaller than tape and compact disc storage mechanisms, and yet still serving data processing equipment in the same manner that solid state random access memories move data into and from the processor's data bus.

SUMMARY OF THE INVENTION

Data is stored in an optical data layer capable of selectively altering light such as by changeable transmissivity, reflectivity, polarization, and/or phase. In the case of a transmissive data layer, data bits are stored as transparent spots on a thin layer of material and are illuminated by controllable light sources. An array of imaging lenslets project an optically enlarged image of the illuminated data onto an array of light sensors. The layer of data is organized into a plurality of regions or patches (called pages) and by selective illumination of each data page one of the lenslets images the data page onto the array of light sensors. Transmitted page data, in this case light passed through the transparent bit locations on the data layer, strike different ones of the arrayed light sensors, thereby outputting a pattern of binary bits in the form of electrical data signals. By selectively and sequentially illuminating different ones of the data regions (pages) on the data layer, correspondingly different data patterns are imaged by the corresponding lenslets onto the same photosensor array, thereby enabling many data pages to be multiplexed at electro-optical speed onto the common photosensor array image plane.

Embodiments of data storage and retrieval systems related to the present invention are disclosed in the above-referenced related application Ser. No. 08/920,847 and international application PCT/US97/07967 as read-only devices, write-only devices, and read/write devices. In accordance with the preferred embodiment of the present invention, the data image undergoes multiple reflections by optical surfaces that also function to distribute the image to its focal plane at the sensors which are uniquely positioned in the plane of the illuminating light source. More particularly, the pages or regions of data are arrayed in a substantially annular, planar pattern on a data layer that is in turn preferably bonded to an annular multi-surface lens array, also of annular configuration. Individual, selected data regions or pages are illuminated by a solid state emitter, such as an LED or laser diode. The lenslets of the multi-surface lens system array collect light from the data layer and direct it toward a first annular portion of a contoured reflective surface that is spaced from the annular data layer and annular lenslet array. The reflective surface redirects and folds the light rays that are to form the data image back (radially inward) toward the center of the device. Another image reflection occurs at a second annular reflective surface adjacent the plane of the data/lens structure sending the image back toward a second portion of the contoured reflective surface inner of the first annular contoured portion. A third reflection occurs at the second inner portion of the contoured reflective surface sending the image back toward a central target area inner of the annular reflective surface adjacent the plane of the data/lens structure. Disposed to receive this thrice reflected and hence multiple folded image, a plurality of solid state sensors formed in a generally planar array are positioned at an image plane substantially in registration with the central target region of the second annular reflective surface.

The optical prescriptions of the lenslet array are designed and computed in an optical system that includes the ray modifying optics of multiple reflector surfaces so that the data images are convergent. Each reflection causes the rays of the data image from a selected page of the data record to be drawn radially inward toward the center of the assembly where the rays pass through an exit window to fall precisely on the sensor array. The optical distance available for imaging the data is the sum of the reflected paths which for a preferred embodiment of three reflections, sometimes herein called a three bounce system, is about four times the thickness of the device because the image rays pass through the device four times.

In the preferred embodiment, the annular data layer and annular lenslets are affixed on a removable data/lenslet card. The data/lens card is removably inserted into a reader that houses the sources of light (emitters), sensor array, reflector optics and interface electronics. Further still, the preferred form of the lenslet surfaces of the data/lenslet sandwich card are diffractive and have a computed prescription that takes into account the resolution requirements of the data as well as the location of the data images relative to the center of the annular arrays. The preferred optical prescriptions including each of the diffractive surfaces is computed using standard formulas or commercial lens design programs.

The reflective and diffractive lens surfaces are fabricated by known optical manufacturing techniques. For example the mirrored contours are made by shaping an optical collector and applying the mirror layer while diffractive surfaces are formed by embossing, molding, or other imprinting on the transmissive surface.

In the above embodiment, it is necessary to incorporate aspheric content in the prescriptions in order to control the rays of the data page images depending upon the radial locations of the data and sensor and the desired traversal paths of the rays therebetween. These required prescriptions are discussed and disclosed more fully below.

These and other features, objects, and advantages of the invention will become apparent to those skilled in the art from the following detailed description and appended drawings.

DETAILED DESCRIPTION

Figure 1:
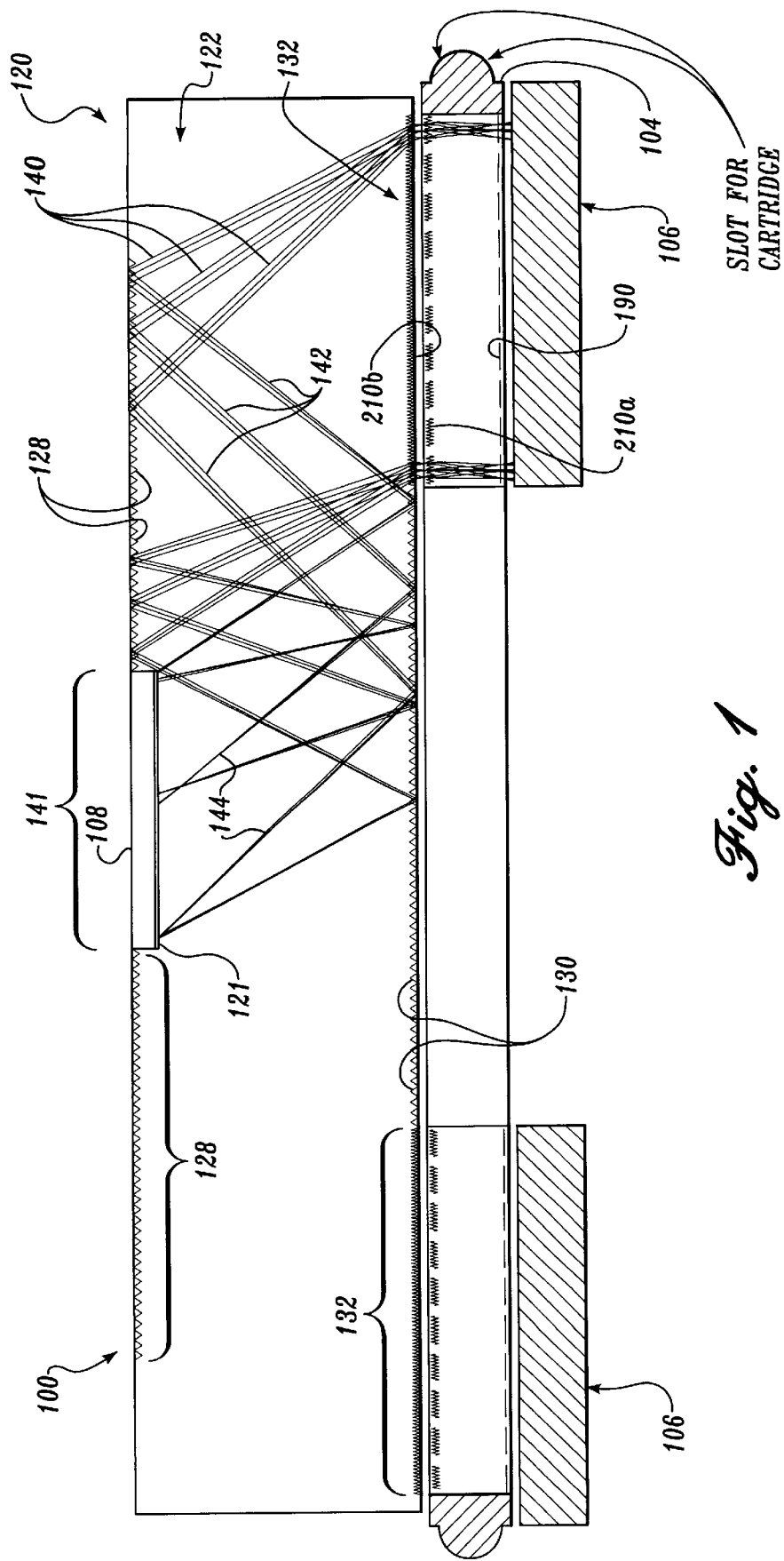
FIG. 1 is a diagrammatic view of one embodiment of the multiple reflection optical memory device of generally annular shape shown in section taken vertically through a central axis with the sensor array positioned near the first of multiple reflective-diffractive surfaces on a solid optically transparent disk-shaped collector and a slot formed between the collector and an array of light sources for receiving a data/lenslet cartridge and illustrating the reflection paths of the image rays.
Figure 2:
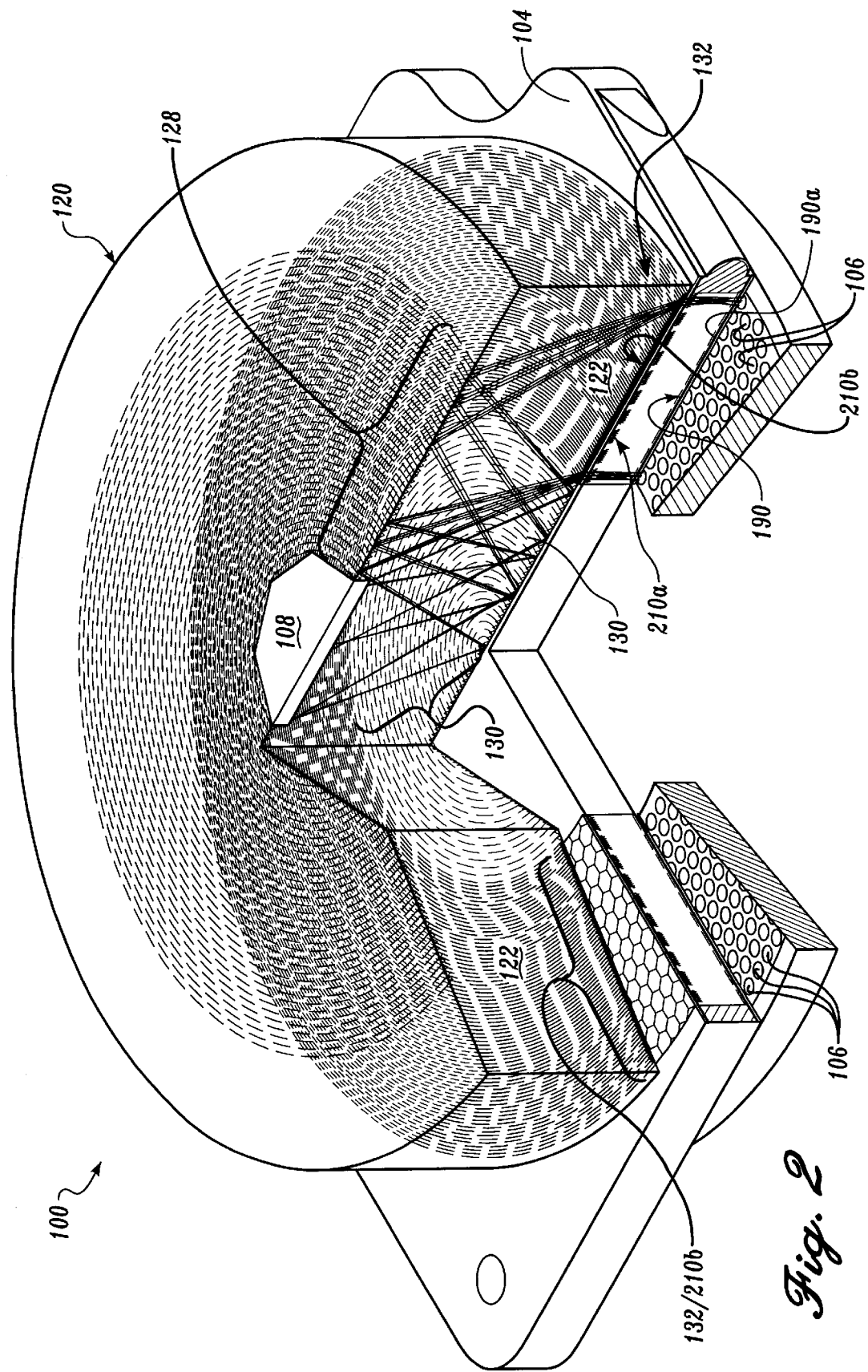
FIG. 2 is an isometric view of the memory device of FIG. 1 cut away on vertical section planes passing through the optical collector, sensor array, data/lenslet cartridge and light sources.

Referring to FIGS. 1 and 2, an embodiment of the present invention is shown to provide a compact, thin profile optical memory device 100 suitable for example, in such applications as notebook style personal computers. The minimal thickness is achieved by multiple folding of the required optical path length needed to resolve the image. This is accomplished by multiple reflections of the image rays after illumination and prior to incidence on the sensor array. The reflection surfaces are also formed to act as lenses, by diffraction such that at each reflection, the image rays are modified to redirect the image toward the center of the assembly. Thus the folded optical path is efficiently used not only to collapse the device thickness but also provide image modifying collector lens surfaces, here by diffraction, for optically processing and directing the image rays to the proper sensor pixels. The modifying effects of the various reflective surfaces enable the image shaping lens prescriptions to be efficiently distributed among the plurality of prescriptive surfaces so that less power is required in any single lens surface.

The embodiment of FIGS. 1 and 2 is shown in the form of optical memory 100 that uses planar reflectors having flat diffractive lens surfaces 128 and 130 which are preferred for economical manufacture but are somewhat more lossy and wavelength sensitive than a contour mirror reflector. Memory device 100 in accordance with the invention is shown to include a data/lens cartridge or card 104, sensor array 108, and light sources 106. Interface electronics not shown here control the selective illumination of sources 106 and the retrieval of data from sensor array 108. Such electronics are fully disclosed in related U.S. Pat. Nos. 5,379,266 and 5,436,871 the published specifications of which are incorporated herein by reference; and in Application Ser. No. 08/920,847 also incorporated herein by reference when published and in the published international application PCT/US97/07967.

The principal components of the memory 100 shown in FIGS. 1 and 2 are mounted in a suitable housing, not shown here, but such as disclosed in above mentioned U.S. Pat. No. 5,436,871, to fix the relative positions of light sources and the reflection and sensor components. A slot may thus be provided in a housing between the light sources 106 and a collector that contains the image folding optics and sensor 108 for receiving insertion and removable of data/lens card 104. As best illustrated in FIG. 2, card 104 has thereon an annular array of data 190 arranged in regions, or pages, sometimes called patches, for selective illumination by sources 106. One patch of data is illuminated at a time so that only that data is imaged onto the sensor 108. When card 104 is inserted into the reader, data 190 are in registration with a correspondingly shaped annular array of page selection light sources 106 supported by the device housing. As described below, card 104 includes an array of first diffractive lenses or lenslets 210a here spaced close to and in direct registration with the patches of data 190. On the opposite side of card 104 from light sources 106 is an image collector module 120 having multiple reflection and diffractive lens surfaces on a solid optically transparent, disk-shaped body 122, including a first diffractive-reflector surface 128, and a second diffractive-reflector surface 130 and an annular window 132 into which light rays from the illuminated data patches enter the collector. In this embodiment collector module 120 also includes a second non-reflective diffractive lens surface 210b that cooperates with the first lenslet surface 210a to collimate the rays as they travel toward the first diffractive reflector surface 128.

Card 104 is a layered sandwich structure including a data layer 190 of information spots which may be binary bits or multiple value gray scale data, organized in multiple data pages, patches or regions (see FIG. 2). A complementary diffractive lens array 210a is bonded to data layer 190 and forms with lenslet array 190 a plurality of lenslet surface systems each disposed in precise, fixed optical registration with a different data patch. This structure enhances the integrity of the optical registration between data and imaging lenslets so that card 104 is installable and replaceable as a unit while maintaining fixed spatial data-to-lens relationship. The card 104 can thus be replaced by other similarly constructed data/lens cards containing the same lenslet specifications but with different data on layer 190. The second lens array 210b is located in the collector module 120, not fixed to the removable card, and cooperates with the card fixed lenslets array 210a but is of less power and does not have the same rigorous specifications of registration with the data.

Collector module body 122 is made of a suitably transparent material such as glass or plastic and has a diameter about matching that of the outer circumference of the annular array of data 190. The thickness of body 122 along the center line of the optical axis depends on the extent of the double folded optical path as described herein but in general is significantly less than that in prior configurations.

First diffractive-reflector surface 128 is on the distal side of collector body 122 from the data/lens card 104 and occupies an annular region inwardly offset from the outermost circumference and terminating at a central area reserved for the sensor array 108. In this embodiment of memory 100, sensor array 108 is preferably nested and optically immersed into a transparent material such as a couplant 121 of elastomeric transparent glue to minimize refraction at the interface with the optical collector body 122. Thus the module 120 mounts the sensor array 108 and efficiently couples the light rays of the image to the sensor pixels.

Second diffractive-reflector surface 130 is located in a central area of the surface of the disk-shaped body 122 inwardly of an annular entry window 132 and lying in a plane parallel to and near the upper face of card 104, i.e., above the card receiving slot.

Thus as a data page is selected by illumination at sources 106, the rays are first acted on by a diffractive lenslet in lens surface 210a of card 104 and then passed through entry window 132 of the image folding optics module 120 where a second diffractive lens surface 210b acts on the image rays.

The first lens surface 210a is placed close to the data layer 190 and is aspheric to collect a maximum amount of the data field light in each page and the second diffractive surface is here located in the collector module 120 and substantially collimates the data rays for the initial traverse toward reflector 128. The lenslet surface 210a is in an expansion zone larger than each of the close pack data pages where data image rays from different but adjacent pages pass through. Furthermore the prescription for second diffractive surface 210b causes the image rays to tip over, radially inward toward the center axis of the device so that a first traverse path 140 in body 122 leans centerward to strike first reflective-diffractive surface 128 at radial locations intermediate the outer circumference and centered sensor area. The rays are then reflected and further diffracted to direct them in a second and folded traverse path 142 toward the second reflective-diffractive surface 130 occupying the centermost area of the collector body 122 on the surface adjacent card 104. A second reflection and diffraction of the rays takes place at surface 130 and the final traverse path 144 of the twice reflected rays causes the page image to be focused on to sensor array 108. At this last interface the sensor elements are immersed in the material of body 122 or an optical couplant to reduce the angle at which the image rays strike the sensor plane so minimal loss of energy occurs.

The entrance window 132 has an annular diffractive lens surface 210b that extends toward the center axis of the assembly only as far as is necessary to lie in registration with the ring or annulus of data 190 on data/lens card 104. In comparison with the device in U.S. Pat. No. 5,436,871, the original reflector becomes a diffractive reflector surface 128, and a second diffractive reflector is provided on the same surface 130 as the entrance window 132, but at an inner radius inside the ring of data. The detector or sensor array 108 is behind a window in the center of the first reflector-diffractor 128. The chip or substrate on which the sensor is formed is nested in a pocket in the collector body 122, to effectively eliminate any thickness increment due to the sensor.

The system configuration of FIGS. 1 and 2 substantially shrinks the device thickness, producing a reduction sufficient to allow a data chapter of about 40 mm diameter to be used in a system with an optical thickness (excluding housing structure) of roughly 6 to 10 mm. Such a marked reduction in the core optical components brings the device for the first time into a size suitable for a small notebook-type computer. Observe that there are some constraints. In this embodiment the inner radius of the annular array of data 190 cannot be less than the maximum radius of the second reflection. That is, the reflector for the second reflector-diffractor 130 would prevent light coming through from patches at a smaller radius. Even if the surface 130 were made semi-transparent, the diffractive surface for the inner area is different from the diffractive surface for the entrance window.

It is assumed in this discussion and in comparison of the previous systems that the optical magnification is held constant. And in fact for all these examples, the magnification is about 20. There are practical reasons for this requirement. For a given page size, i.e., for a given amount of data, the size of the sensor array is set by the effective diameter of the data page times the optical magnification. If the page size is determined by customer demand and the prescription of the critical first lens surface (first surface acting on image rays emanating from the data layer), then the sensor size then is set by the magnification. Because cost rises exponentially with larger and larger sensor area size (because of silicon costs and wafer yield), the magnification is chosen to produce a retrievable image on a sensor chip that has a relatively small area, in this case of about 1.1 cm in diameter for the roughly circular, polygonal sensor shape (an area≈0.95 $cm^2$) for cost effectiveness. That trade off must also be balanced with functionality, especially the signal to noise ratio, which falls rapidly as the pixel size drops significantly below about ten microns square. Six or seven microns square is suitable for each sensor pixel but, say, one micron square is beyond current fabrication and/or functional capability. The point is that for high density high capacity optical data systems based on the disclosed embodiments there are constraints on the overall optical design and by multiple folding of the image rays the objective of a thinner design is best realized.

The data image projected onto array 108 in this preferred embodiment is generated from pages stored in a close pack pattern as indicated in FIG. 2 and more particularly disclosed in PCT/US97/07967. By illuminating selected regions or pages of data layer 190, e.g., a patch 190a, the image, as transformed by an associated lenslet system, is enlarged, shifted radially inwardly, twice reflected, and further modified by the optical prescriptions on surfaces 128 and 130. While the sensor elements 108a may be arrayed in various suitable ways, here they are preferably formed on a unitary substrate (chip) of silicon in a regular x-y orthogonal sensor grid as more fully disclosed in application Ser. No. PCT/US97/07967 incorporated by reference herein. To accommodate that format, sensor array 108 is a square with the corners lopped off to fit within the inside concentric area 140 in the center of the first reflector. The sensor thus is roughly a circle or many sided polygon. The active area of sensor array is somewhat greater than the projected image size for the reasons described below. At spaced circumferential locations adjacent to the grid of the sensor elements, a plurality of fiducial detectors are provided, having the same or similar photosensing properties as in the main field of sensor elements 108a, to aid in the registration and/or reading of each data image as described in related U.S. application Ser. No. 07/815,924, now U.S. Pat. No. 5,379,266, and co-pending international Application Ser. No. PCT/US97/07967.

The redirection of the image rays by the optical prescription of diffractive surfaces 210b, 128 and 130 of module 120 also serves as a collector lens, to collect and refocus the data page image onto sensor 108.

Thus, in operation, one of many pages of binary data is selected from annular data layer 190 by energizing a chosen cell of annular arrayed light sources 106. This causes data page light rays to emanate toward and be reflected by surface 128 and 130 in a double folding of the optical path which distributes the data bit rays that become the page image so as to strike the arrayed photosensing elements of sensor array 108. The data page image has roughly the shape of a polygon such as a square with the corners notched out, and is sized relative to the sensor array 108 so that the sensor area is somewhat greater than the image area to accommodate a guard band around the sensor for capturing pixels when the image is slightly misregistered or the magnification-focus is not exact. The image thus underfills the available sensor area of array 108.

The individual data bits within a single data page are here arranged in closely spaced rows and columns and at densities that use to advantage high resolution optical films and other record media including but not limited to photochemical films, provided as layer 190.

As described in related U.S. Pat. No. 5,379,266, and international application Ser. No. PCT/US97/07967, the data may be recorded onto layer 190 by photochemical processes using a page composer and imaging optics to successively expose each page or region on the data layer to a field of data light bits, by direct photographic reproduction including contact printing and/or molding or embossing from a master as in the case of conventional compact disc records. The data bits are in a size range of 2.25 to 0.5 microns and a center-to-center spacing also in that range. Each data page is formed by the amount of individual data bits that can be collected and grouped into a cell and at the preferred density range of about $1\times10^8$ bits per $cm^2$, it has been found that about 175 kilobits of data per page (or patch or region) of about 0.55 mm in diameter is a suitable quantity and patch size that results in the generation of a data image after magnification that can be reliably sensed by photosensitive elements of sensor array 108. In this case, the preferred embodiment provides an optical image enlargement through the various lenslet systems and collector lens effect of surface 128 of approximately 20 to 30 times data density on layer 190. Thus, with the currently preferred mean magnification of about 20×, the center to center spacing of the projected image elements on the sensor plane and thus the spacing of elements 108a of array 108 is on the order of 20 microns. Also as described in co-pending international application Ser. No. PCT/US97/07967, the sensor array has oversampling density of for example 4× the size of a single image element. That is each image element is sensed with a 2×2 set of sensor elements 108a. Thus the multi-sided or roughly circular sensor array 108 for sensing a page of data has area of about 0.95 $cm^2$ and contains about 824 kilobits of sensor elements.

The particular structure and operation of the sensor array 108 and various alternatives to the preferred embodiment are described in greater detail in related U.S. Pat. No. 5,379,266, and co-pending international application Ser. No. PCT/US/97/07967. Briefly, each data bit which may be represented by a spot of light from the imaged page, causes one or more photosensitive elements 108a of sensor array 108 to sense the value of the data spot, such as whether it represents a "1" or a "0" bit. Although different forms of data layer 190 may be employed, in the present preferred embodiment data layer 190 is a light transmissive mask or film in which binary "1" bits are transmissive while binary "0" bits are opaque or light blocking.

It will thus be seen that the read elements and operation of optical memory 100 provide for accessing each of many hundreds of regions (pages) of data having, for example, one 100 kilobits per page at about 1 micron bit size. Moreover, in this present invention, the magnitude of the gross data storage is greatly enhanced by configuring the data in an annular array, encircling the sensor window to allow common sensor array 108 to read any one of the surrounding data pages. Selecting a single data page from data layer 190 by energizing one cell of light sources 106 accesses an entire page of 175 kilobits. These data are available at the interface contained in integrated circuitry not separately shown here but which may be located on top of the plane of sensor array 108, or other suitable location and operating at access speeds typical of electro-optical switching, as described in the above mentioned co-pending international application. Data words that make up different portions of the entire page may be selectively addressed at circuit 112, such as a column or row of data on each accessed page, or the entire page may be output as a parallel dump. Each row or column of data within an accessed page may contain as many as 485 data bits given the above configuration, hence making fast random retrieval of exceedingly long bit words of this magnitude within the capability of the optical memory 100.

In dimensions one embodiment of the invention has a nominal 175 kilobit page or patch, formed by 37 zones each containing 69×69 bits at one micron on center for a total of 4,761 bits/zone, or 176,157 bits/patch. The data density is 1 million bits/$mm^2$ and the record capacity on a card is 176,157 times the number of patches/card. Sensor array 108 occupies a pattern similar to the patch but oversized and in this case being about 10.24×10.24 mm. Within the sensor area an array of 1024×1024 diodes or other sensor pixels are satisfactory for coverage including oversampling when using 10 micron diodes. The data/lens annulus on card 104 occupies an outer and inner radii of 21 mm and 9 mm respectively, covering an area of about 1131 $mm^2$. This area contains as many as 4700 patches or pages of data, each patch or data page being selectable at electro-optical switching speeds and retrievable by the high speed switching capabilities of image reading and electronic addressing devices. In effect, the multiple pages of data bits are multiplexed onto the image plane at sensor array 108 by electronic switching of read light sources 106 followed by high speed addressing. The output data are thus available in the above-mentioned form for direct application to a processor data bus.

There are various innovations that enable memory 100 to function effectively in the above described configuration. The combined reflective and diffractive surfaces 128 and 130 reflect the image light and act as part of a collector lens function in combination with the data lenslets. Because of the aspheric component on reflector surfaces 128 and 130, beams from the outer pages are effectively focused on the radially inward sensor array 108. This additional focusing means that the bundles of image rays from the radially outer pages of layer 190 are collimated by the first lens surface 210a, thus the extra distance of the radially outer data pages relative to those radially inward, does not contribute to the image magnification.

The various lens and reflective surfaces are computed for optimum prescription, as shown in the following exemplary tables for the two reflection optical memory 100 of FIGS. 1 and 2.

TABLE I

Example of prescriptions/materials

LENS DATA for FIGS. 1 and 2
Two Reflection System

| SURFACE | RADIUS | THICKNESS | APERATURE RADIUS | GLASS | NOTE |
|---|---|---|---|---|---|
| 0 | — | 0.100000 | 0.200000 | ULTEM | Data Surface |
| 1 | — | 1.703533 | 0.260000 | ULTEM | |
| 2 | — | 0.500000 | 0.260000 | ACRYLIC | Diff. Lens |
| 3 | — | — | 0.260000 | AIR | |
| 4 | — | — | 0.260000 AK | AIR | |

TABLE I-continued

Example of prescriptions/materials

| | | | | | |
|---|---|---|---|---|---|
| 5 | — | 0.200000 | 0.260000 K | AIR | |
| 6 | — | 8.496514 | 21.000000 | ACRYLIC | Entrance Diff. |
| 7 | — | — | 21.000000 P | ACRYLIC | Diff. Mirror |
| 8 | — | — | 21.000000 P | REFLECT | |
| 9 | — | −8.496514 P | 21.000000 | ACRYLIC | |
| 10 | — | — | 9.500000 | REFLECT | Second Diff. Mirror |
| 11 | — | 6.496514 P | 9.500000 P | ACRYLIC | |
| 12 | — | 0.200000 | 9.500000 P | ACRYLIC | |
| 13 | — | 1.000000 | 5.000000 | ACRYLIC | Sensor Window |
| 14 | — | 0.100000 | 5.000000 | ELASTOMER | |
| 15 | — | 0.100000 | 5.000000 | SHOW SURF | |
| 16 | — | — | 5.000000 | | Sensor |

DIFFRACTIVE SURFACE DATA

| | | | | | | | | | |
|---|---|---|---|---|---|---|---|---|---|
| 2 | DOE DFX | 8 - | ASYMMETRIC | DIFFRACTIVE | SRF | DOR 1 | | DWV | 0.645000 |
| | | | | | | KCO 1 | | KDP | — |
| | DF0 | — | DF1 | — | DF2 | 0.161852 | | DF3 | −0.460161 |
| | DF4 | — | DF5 | −0.455882 | DF6 | — | | DF7 | 0.000520 |
| | DF8 | — | DF9 | 0.001039 | DF10 | 0.056198 | | DF11 | — |
| | DF12 | −0.055828 | DF13 | — | DF14 | −0.027891 | | DF15 | — |
| | DF16 | — | DF17 | — | DF18 | — | | DF19 | — |
| | DF20 | −0.026269 | DF21 | — | DF22 | — | | DF23 | — |
| 6 | DOE DFR | 8 - | SYMMETRIC | DIFFRACTIVE | SRF | DOR 1 | | DWV | 0.645000 |
| | | | | | | KCO 1 | | KDP | — |
| | DF0 | — | DF1 | −0.034396 | DF2 | 2.0578e-05 | | DF3 | — |
| 8 | DOE DFR | 8 - | SYMMETRIC | DIFFRACTIVE | SRF | DOR 1 | | DWV | 0.645000 |
| | | | | | | KCO 1 | | KDP | — |
| | DF0 | — | DF1 | 0.013246 | DF2 | −6.4803e-05 | | DF3 | 5.6824e-08 |
| 10 | DOE DFR | 8 - | SYMMETRIC | DIFFRACTIVE | SRF | DOR 1 | | DWV | 0.645000 |
| | | | | | | KCO 1 | | KDP | — |
| | DF0 | — | DF1 | 0.006580 | DF2 | −4.1802e-05 | | DF3 | 3.3944e-07 |

REFRACTIVE INDICES

| SRF | GLASS | RN1 | RN2 | RN3 | VNBR | TCE |
|---|---|---|---|---|---|---|
| 0 | ULTEM | 1.650783 | 1.652245 | 1.649365 | 225.975134 | — |
| 2 | ACRYLIC | 1.488490 | 1.488924 | 1.488069 | 571.701364 | — |
| 14 | ELASTOMER | 1.581720 | 1.582410 | 1.581051 | 427.917648 | — |
| 15 | SHOW SURF | 1.581720 | 1.582410 | 1.581051 | 427.917648 | — |

WAVELENGTHS, MICRONS

| CURRENT | WV1/WW1 | WV2/WW2 | WV3/WW3 |
|---|---|---|---|
| 1 | 0.645000 | 0.635000 | 0.655000 |
| | 1.000000 | 0.500000 | 0.500000 |

These above provided tables describe a lens set prescription and reflectors that would be effective for a page at the outer edge of the data/lens card 104. This is the optically most difficult location. Preferably, data pages that are closer to the center should have revised prescriptions for the lenses, computed using a conventional lens design program such as the one mentioned below, and inputting the radial offsets for the interior lenslets. The spacings and the reflector remain the same.

A commercial lens design program called OSLO6 was used to do the design shown in Table I. The program is a product of Sinclair Optics, Inc., Fairport, N.Y. The number specifications for each surface and material are provided using conventional notation. Thus the first column lists the surface # (srf #) and includes srf #s 0–16 starting with the object srf=0 (data layer) and continuing through the various optical surfaces and materials to the image srf #16 (sensor plane). The numbers that follow the first set of srfs are the prescription values including various dimensions and materials. Then follows diffractive coefficients at the applicable srfs # 2,6,8 and 10; refractive indices for the refractive srfs # 0,2,14 and 15; and finally the operating wavelengths in microns. The table shows the values for a data patch at the outermost radius of the data card and lens system. This is the most severe optical location. Data patches and associated lens surfaces closer to the center are incrementally corrected by using the above program and inputting the radial offset. As the path length shortens with the position of the object patches that are located closer to the center of the device, the magnification increases to maintain image uniformity at the sensor.

Figure 3:
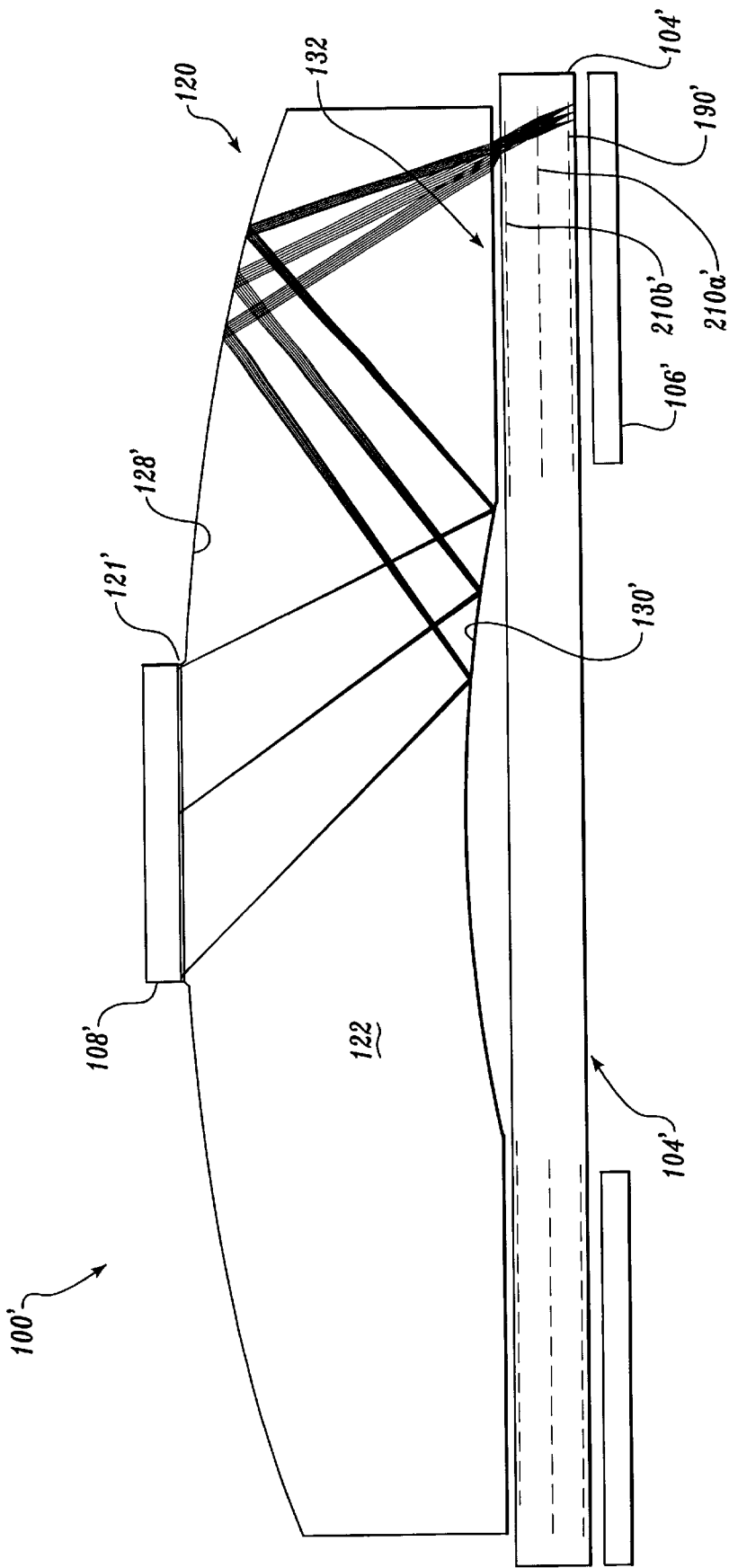
FIG. 3 is a diagrammatic view similar to FIG. 1 of an embodiment preferred for its relatively low optical losses and wavelength insensitivity in which the multiple reflection optical memory has mirrored contoured surfaces on opposite faces of the optically transparent disk-shaped collector.

FIG. 3 depicts an embodiment of the two-reflection configuration that has the advantage over the above embodiment in lens efficiency and minimal chromatic smear. By using shaped reflectors which have superior optics over diffractive reflectors which are wavelength sensitive and may cause smearing of the image, especially with small angles of incident rays, the optical memory 100' is preferred for many applications. While more costly to manufacture, the higher cost optics are in the collector module 120' which serves as the reader or drive, and the less costly (to manufacture) diffractive elements are in the card 104' which has the higher volume sales and hence production and is more cost sensitive on a per unit basis.

Figure 4:
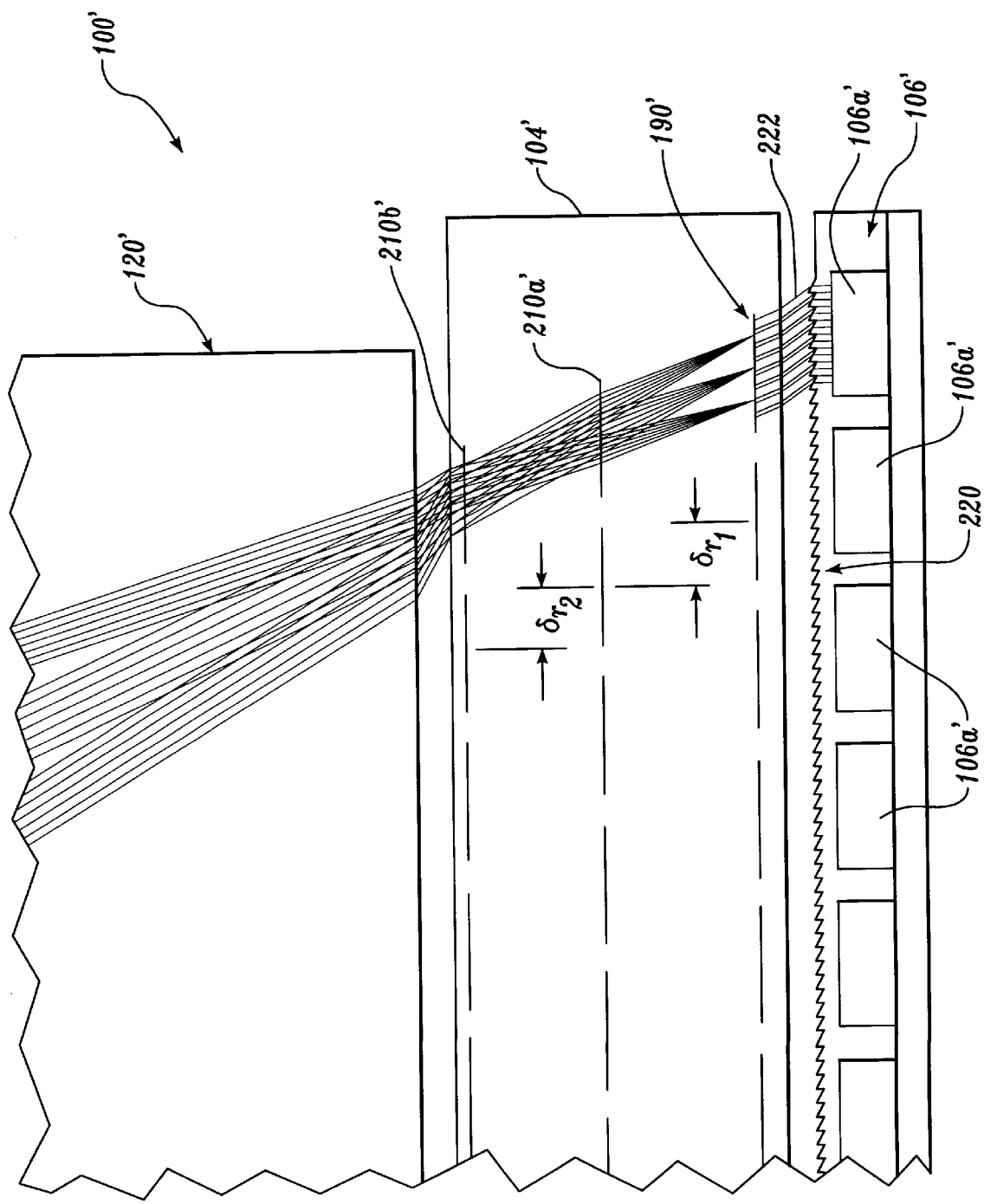
FIG. 4 is an enlarged fragmentary view of the embodiment of FIG. 3 illustrating in greater detail the radially inward redirection or tilting of the image rays exiting from the data layer of the cartridge.

Thus memory 100' is shown having mirrored contoured surfaces on a collector body 122' such as of optical glass or plastic at the first and second reflector surfaces 128' and 130' in place of the diffractive flat surfaces 128 and 130 of the embodiment in FIGS. 1 and 2. Also in comparison to the above described embodiment, memory 100' as best shown in FIG. 4 has the first and second diffractive lens surfaces 210a' and 210b' forming a two surface lens system embedded in the cartridge 104' so that registration of both of the first two surfaces are fixed relative to the data layer 190 and are radially offset for the reasons explained below. The altered rays that exit the cartridge enter the collector optics through a transparent window 132' of optical collector body 122' and are by the offset arrangement of the data 190, and diffractive lenslet surfaces 210a' and 210b' tilted upwardly and radially inward in the drawing so as to intercept the mirrored reflector surface 128' at a strike angle as shown. The concave contour of reflector surface 128' provides the field collection effect needed to further redirect the image toward the center of the device and the second reflection occurs at a convex mirrored surface 130' centered in the collector and positioned proximate the plane of the cartridge slot.

To cause the image rays to be tipped inward immediately as they are generated in the cartridge, the light from sources 106' is redirected from a normal exit path by a diffractive transmissive grating 220, and data layer 190, and the first and second lens surfaces 210a' and 210b' are relatively offset by $\delta r_1$ and $\delta r_2$ in the radial direction as best indicated in FIG. 4. These offsets efficiently tip the image rays over into an inward angled path toward the center of the assembly so that the successive reflections off of surfaces 128' and 130' have less requirement to act as collector lens in bringing the image to the centered sensor array 108'. Compare the embodiment of FIGS. 1 and 2 wherein the axis of the page image is normal to the cartridge and data layer as the rays exit the first lens surface 210a. There the tip over of the rays must be initiated by the field lens effect in the second diffractive lens surface 210b that is in the collector structure.

The grating 220 is fabricated at the exit surface of light sources 106' and is in annular pattern varying in markings with radius so that the illuminating rays 222 from selected sources 106a' are shifted to angle inward along the centerline of the optical axes created by the offset data 190, lenslet surfaces 210a' and 210b'. Thus the first and second lenslet surfaces 210a' and 210b' are fully illuminated with the data rays.

The applicable prescriptions for the embodiment of FIGS. 3 and 4 are set forth in Table II and contain the values and materials for construction of this embodiment. The prescriptions for the various surfaces are read as indicated above for the previously discussed table and include the tilt and decenter specifications.

TABLE II

Example of prescriptions/materials

*LENS DATA for FIGS. 3 and 4
Two Reflect

| SRF | RADIUS | THICKNESS | APERTURE RADIUS | GLASS | SPE | NOTE |
|---|---|---|---|---|---|---|
| OBJ | — | 0.100000 | 0.241400 | ULTEM | C | Data plane |
| 1 | — | — | 0.251400 | ULTEM | P * | Dummy Surface |
| 2 | — | 1.095645 V | 0.251400 | ULTEM | P * | Spacer |
| 3 | — | 1.200534 V | 0.251400 PK | ACRYLIC | C * | 1st Lens |
| AST | — | 0.250000 | 0.251400 APK | AIR | * | 2d Lens |
| 5 | — | 9.457062 V | 20.750000 | ULTEM | C * | Offset |
| 6 | −78.570042 V | −8.457062 P | 20.750000 P | REFLECT | * | |
| 7 | −45.515482 V | 0.457062 P | 9.200000 | REFLECT | | |
| 8 | — | — | 9.200000 | ULTEM | P | |
| 9 | — | 0.100000 | 4.600000 | ELASTOMER | | Elastomer |
| 10 | — | — | 4.600000 | SHOW SURF | | Dummy Surface |
| IMS | — | — | 4.600000 P | | | Detector Array |

*CONIC AND POLYNOMINAL ASPHERIC DATA

| SRF | CC | AD | AE | AF | AG |
|---|---|---|---|---|---|
| 6 | 7.332831 | — | — | — | — |

*DIFFRACTIVE SURFACE DATA

| 3 | DOE DFX | 10 - | ASYMMETRIC | DIFFRACTIVE | SRF | DOR 1 | DWV 0.596000 |
|---|---|---|---|---|---|---|---|
| | | | | | | KCO 1 | KDP — |
| | DF2 | −0.020784 | DF3 | −0.450141 | DFS | −0.265473 | DF7 −0.122336 |
| | DF9 | −0.146844 | DF10 | 0.046567 | DF12 | 0.030282 | DF14 0.116463 |
| | DF16 | −0.037808 | DF18 | −0.289418 | DF20 | −0.073470 | DF27 −0.264863 |
| | DF40 | 44.950907 | | | | | |
| 4 | DOE DFX | 10 - | ASYMMETRIC | DIFFRACTIVE | SRF | DOR 1 | DWV 0.596000 |
| | | | | | | KCO 1 | KDP — |
| | DF2 | 0.080679 | DF3 | −0.195976 | DF5 | −0.196008 | DF7 0.112734 |
| | DF9 | 0.087077 | DF10 | 0.072885 | DF12 | 0.032135 | DF14 0.093248 |
| | DF16 | 0.045907 | DF18 | 0.144033 | DF20 | 0.002459 | DF27 −0.965498 |

*REFRACTIVE INDICES

| SRF | GLASS | RN1 | RN2 | RN3 | VNBR | TCE |
|---|---|---|---|---|---|---|

TABLE II-continued

Example of prescriptions/materials

| | | | | | | |
|---|---|---|---|---|---|---|
| 0 | ULTEM | 1.658417 | 1.660132 | 1.656759 | 195.199775 | — |
| 1 | ULTEM | 1.658417 | 1.660132 | 1.656759 | 195.199775 | — |
| 2 | ULTEM | 1.658417 | 1.660132 | 1.656759 | 195.199775 | — |
| 3 | ACRYLIC | 1.490785 | 1.491264 | 1.490263 | 490.384716 | — |
| 4 | AIR | 1.000000 | 1.000000 | 1.000000 | — | 236.000000 |
| 5 | ULTEM | 1.658417 | 1.660132 | 1.656759 | 195.199775 | — |
| 6 | REFLECT | 1.658417 | 1.660132 | 1.656759 | 195.199775 | 62.000000 |
| 7 | REFLECT | 1.658417 | 1.660132 | 1.656759 | 195.199775 | 62.000000 |
| 8 | ULTEM | 1.658417 | 1.660132 | 1.656759 | 195.199775 | — |
| 9 | ELASTOMER | 1.516454 | 1.516866 | 1.516061 | 642.048191 | 71.000000 |
| 10 | SHOW SURF | 1.519801 | 1.520218 | 1.519403 | 637.751278 | 74.000000 |
| 11 | IMAGE SURFACE | | | | | |

*TILT/DECENTER DATA

| | | | | | | | | | |
|---|---|---|---|---|---|---|---|---|---|
| 1 | DT | 1 | DCX | — | DCY | -0.060000 | DCZ | — |
| | | | TLA | — | TLB | — | TLC | — |
| 2 | DT | 1 | DCX | — | DCY | — | DCZ | — |
| | | | TLA | 25.700011 | TLB | — | TLC | — |
| 3 | RCO | 3 | | | | | | |
| | DT | -1 | DCX | — | DCY | — | DCZ | — |
| | | | TLA | -25.700011 | TLB | — | TLC | — |
| 4 | DT | -1 | DCX | — | DCY | — | DCZ | — |
| | | | TLA | -25.700011 | TLB | — | TLC | — |
| 5 | DT | 1 | DCX | — | DCY | 19.650000 | DCZ | — |
| | | | TLA | — | TLB | — | TLC | — |

Figure 5:
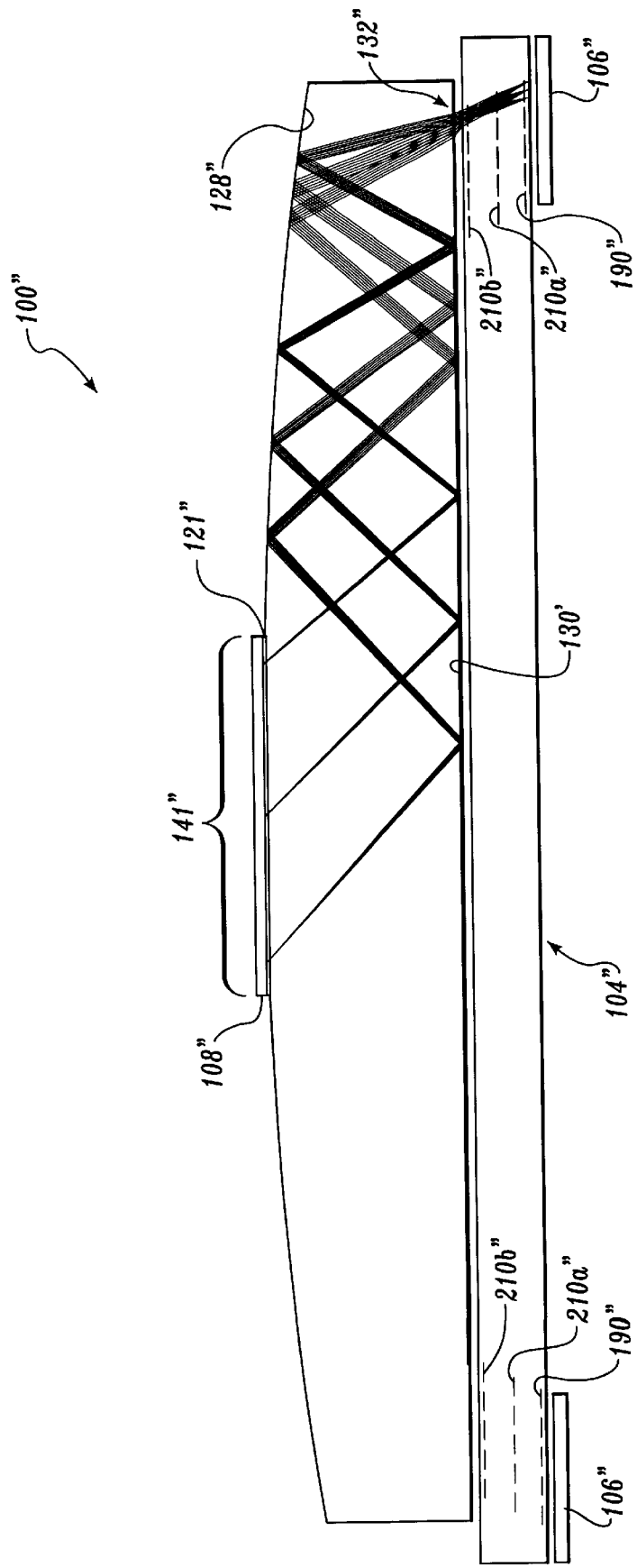
FIG. 5 is a diagrammatic view of another alternative embodiment of the present invention similar to that of FIG. 3, the alternative embodiment having four successive reflections off the opposed mirrored surfaces of the optical collector before the image is incident on the sensor array.

FIG. 5 is a still further alternative embodiment having some features similar to that in FIG. 3 but in which memory 100″ has a contoured lens reflector 128″ and a flat plane mirror at reflector 130″ constructed so that the opposing reflective surfaces of the collector body cause four reflections (5 traversals) of the image rays between the data on card 104″ and incidence on sensor array 108″. Because the four successive reflections reduce the required angle of reflection off the collector surfaces, the power of each reflection surface is lessened accounting for the small curvature of first reflector surface 128″ and the zero or flat shape of reflector 130″.

Figure 6:
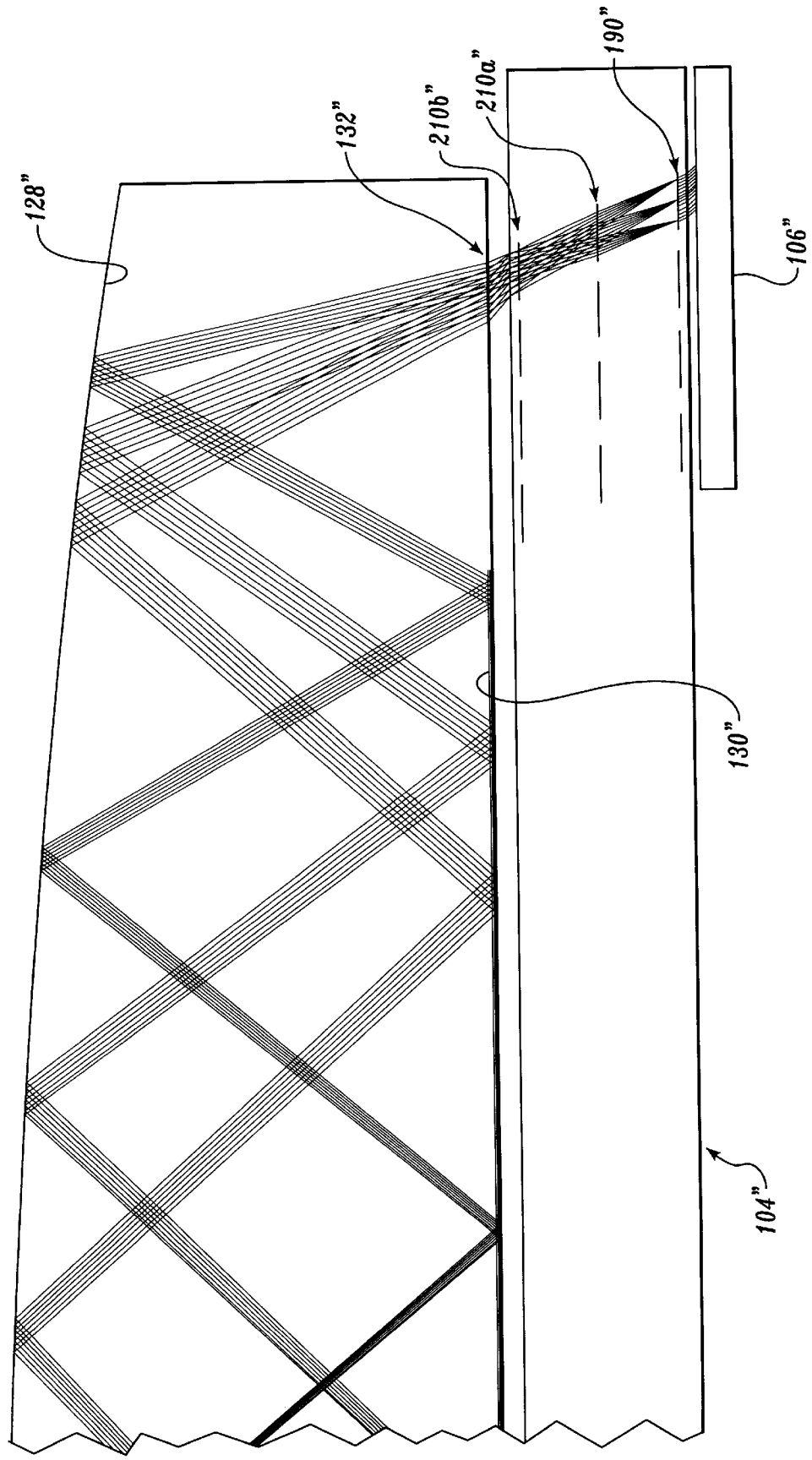
FIG. 6 is an enlarged fragmentary view of the embodiment of FIG. 5 illustrating in greater detail the radially inward redirection or tilting of the image rays as they exit from the data layer.

FIG. 6 shows that the rays are tilted at the outset as in FIGS. 3 and 4 by redirecting the illumination rays from sources 106″ and the radial offsetting of data layer 190″ and the first and second lens surfaces 210a″ and 210b″. This configuration is somewhat less expensive to fabricate than the memory 100′ of FIGS. 3 and 4 because only one of the reflective surfaces needs contouring. Furthermore the doubling of reflections further collapses the optical path and shrinks the thickness of the overall assembly but there is some greater loss of light energy and increased chance of image misregistration. Table III describes the surfaces and materials to construct the four-reflection folded memory device of this embodiment.

TABLE III

Example of prescriptions/materials

*LENS DATA for FIGS. 5 and 6
Four Reflect

| SRF | RADIUS | THICKNESS | APERTURE RADIUS | GLASS | SPE | NOTE |
|---|---|---|---|---|---|---|
| OBJ | — | 0.100000 | 0.241400 | ULTEM | C | Data plane |
| 1 | — | 0.798782 V | 0.251400 | ULTEM | P * | Spacer |
| 2 | — | 1.100285 V | 0.251400 PK | ACRYLIC | C * | 1st Lens |
| AST | — | 0.250000 | 0.251400 APK | AIR | * | 2d Lens |
| 4 | — | 5.786230 V | 20.750000 | ULTEM | C * | Offset |
| 5 | -192.130608 V | -5.786230 P | 20.750000 P | REFLECT | * | |
| 6 | — | 5.786230 P | 9.000000 | REFLECT | | |
| 7 | -192.130608 P | -5.786230 P | 9.000000 | REFLECT | * | |
| 8 | — | 5.786230 P | 9.000000 | REFLECT | | |
| 9 | — | 0.100000 | 4.600000 | ELASTOMER | | Elastomer |
| IMS | — | — | 4.600000 P | | | Detector Array |

*CONIC AND POLYNOMINAL ASPHERIC DATA

| SRF | CC | AD | AE | AF | AG |
|---|---|---|---|---|---|
| 5 | 56.531060 | — | — | — | — |
| 7 | 56.531060 | — | — | — | — |

*DIFFRACTIVE SURFACE DATA

| | | | | | | | | |
|---|---|---|---|---|---|---|---|---|
| 2 | DOE DFX | 8 - | ASYMMETRIC | DIFFRACTIVE | SRF | DOR | 1 | DWV 0.596000 |

TABLE III-continued

Example of prescriptions/materials

|   |   |   |   |   |   | KCO | 1 | KDP | — |
|---|---|---|---|---|---|---|---|---|---|
|   | DF2 | -0.052292 | DF3 | -0.518724 | DF5 | -0.295610 | DF7 | -0.207520 |   |
|   | DF9 | -0.241950 | DF10 | 0.121376 | DF12 | 0.219839 | DF14 | 0.258261 |   |
|   | DF16 | -0.224028 | DF20 | -0.386044 | DF27 | -0.440856 | DF33 | -8.374095 |   |
| 3 | DOE DFX | 10 - | ASYMMETRIC | DIFFRACTIVE | SRF | DOR | 1 | DWV | 0.596000 |
|   |   |   |   |   |   | KCO | 1 | KDP | — |
|   | DF2 | -0.000307 | DF3 | -0.267952 | DF5 | -0.254521 | DF7 | 0.138927 |   |
|   | DF9 | 0.113199 | DF10 | 0.087437 | DF12 | 0.030885 | DF14 | 0.028562 |   |
|   | DF16 | 0.080941 | DF18 | 0.060416 | DF20 | 0.020285 | DF27 | -0.313628 |   |

*REFRACTIVE INDICES

| SRF | GLASS | RN1 | RN2 | RN3 | VNBR | TCE |
|---|---|---|---|---|---|---|
| 0 | ULTEM | 1.658417 | 1.660132 | 1.656759 | 195.199775 | — |
| 1 | ULTEM | 1.658417 | 1.660132 | 1.656759 | 195.199775 | — |
| 2 | ACRYLIC | 1.490755 | 1.491264 | 1.490263 | 490.384716 | — |
| 3 | AIR | 1.000000 | 1.000000 | 1.000000 | — | 236.000000 |
| 4 | ULTEM | 1.658417 | 1.660132 | 1.656759 | 195.199775 | — |
| 5 | REFLECT | 1.658417 | 1.660132 | 1.656759 | 195.199775 | 62.000000 |
| 6 | REFLECT | 1.658417 | 1.660132 | 1.656759 | 195.199775 | 62.000000 |
| 7 | REFLECT | 1.658417 | 1.660132 | 1.656759 | 195.199775 | — |
| 8 | REFLECT | 1.658417 | 1.660132 | 1.656759 | 195.199775 | — |
| 9 | ELASTOMER | 1.516454 | 1.516866 | 1.516061 | 642.048191 | — |
| 10 | IMAGE SURFACE |   |   |   |   |   |

*TILT/DECENTER DATA

| 1 | DT | 1 | DCX | — | DCY | — | DCZ | — |
|---|---|---|---|---|---|---|---|---|
|   |   |   | TLA | 24.500000 | TLB | — | TLC | — |
| 2 | RCO | 2 |   |   |   |   |   |   |
|   | DT | -1 | DCX | — | DCY | — | DCZ | — |
|   |   |   | TLA | -24.500000 | TLB | — | TLC | — |
| 3 | DT | -1 | DCX | — | DCY | — | DCZ | — |
|   |   |   | TLA | -24.500000 | TLB | — | TLC | — |
| 4 | DT | -1 | DCX | — | DCY | 19.650000 | DCZ | — |
|   |   |   | TLA | — | TLB | — | TLC | — |

Additional Alternative Embodiments

Figure 7:
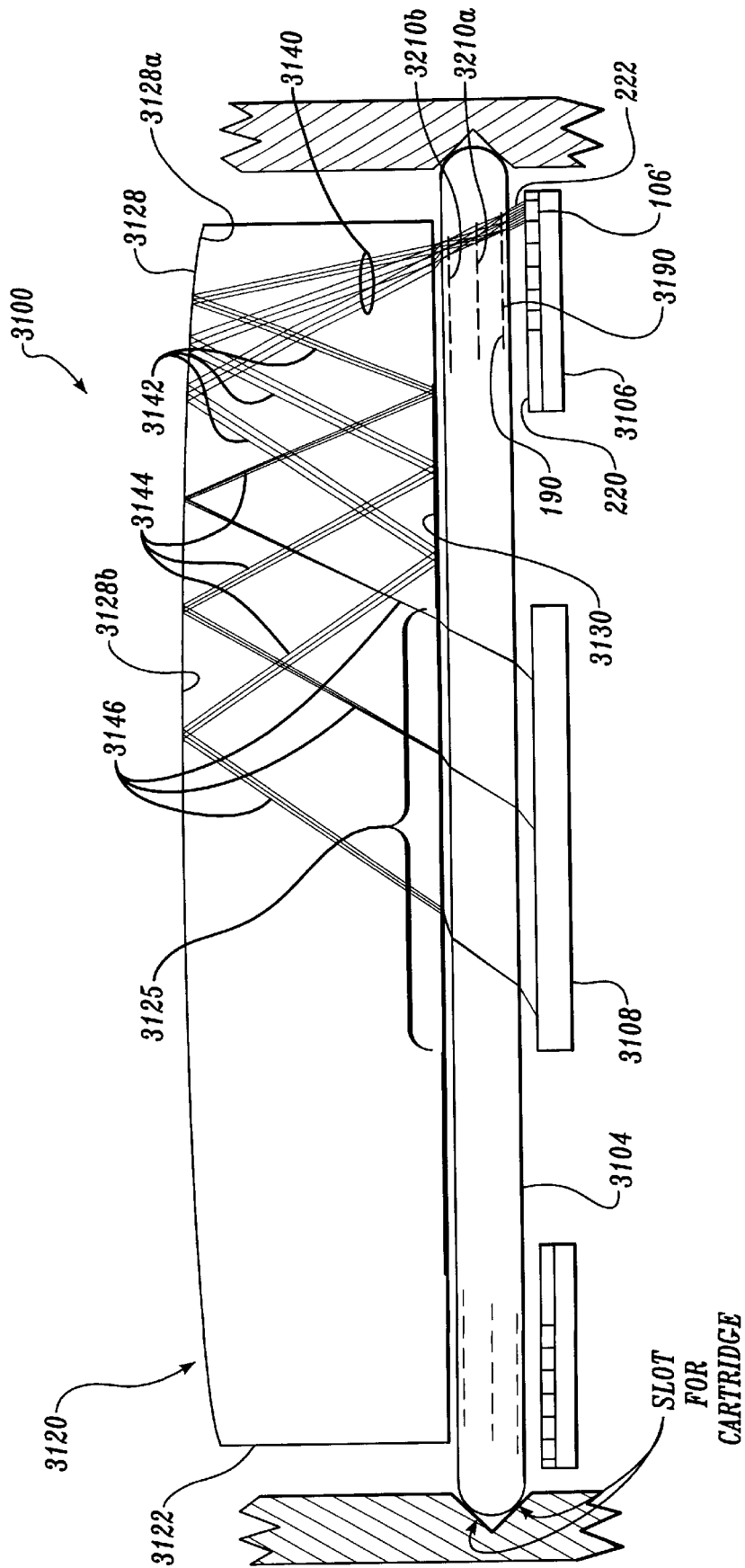
FIG. 7 is a diagrammatic view of another alternative embodiment of the present invention similar to that of FIG. 5, the alternative embodiment having three successive reflections off the opposed mirrored surfaces of the optical collector before the image is incident on the sensor array, where the sensor array is located proximate the data/lenslet cartridge opposite the optical collector.

The embodiment of FIG. 7 provides another compact, thin profile optical memory device 3100 equally suitable for example, in such applications as notebook-style personal computers. The minimal thickness is achieved in part by multiple folding of the required optical path length needed to resolve the image and in part by placement of the sensor array. The multiple folding is accomplished by multiple reflections of the image rays after illumination and prior to incidence on the sensor array. The reflection surfaces act to redirect the image inwardly toward the center of the assembly at each reflection. Thus, the folded optical path efficiently collapses the device thickness and also serves as a collector lens: collecting and refocusing the data page image onto sensor 3108 and directing the image rays to the proper sensor pixels. Placing the chip or substrate containing the sensor array at the center of annular light source array 3106 opposite the image folding optics module 3120 effectively eliminates any thickness increment due to the sensor array 3108.

The alternative embodiment of FIG. 7 differs from the two-reflection and four-reflection embodiments shown in FIGS. 1 through 6, above, primarily in the placement of the sensor array. The three-reflection embodiment of FIG. 7 includes some features similar to the embodiment shown in FIGS. 5 and 6. In FIG. 7 memory 3100 has a contoured lens reflector 3128 and a flat plane mirror at reflector 3130 constructed so that the opposing reflective surfaces of the collector body cause three reflections (four traversals) of the image rays between the data on card or cartridge 3104 and incidence on the image surface of sensor array 3108. However, in FIG. 7 planar reflector 3130 is formed as an annular ring having an exit window 3125 formed at its center. Furthermore, contoured reflector surface 3128 includes a first annular concave portion 3128a for redirecting incoming image rays downward and radially inwardly toward opposing planar reflector 3130 and an inner concave portion 3128b for redirecting the image rays reflected from opposing planar reflector 3130 radially inwardly and downwardly toward the exit window 3125 where sensor array 3108 is located opposite the data cartridge slot. Because the three successive reflections reduce the required angle of reflection off the collector surfaces, relative to the two-reflection embodiments described above, the power of each reflection surface is lessened accounting for the small curvature of contoured reflector surface 3128 relative to the reflector surface 128' shown in FIG. 3 and the zero or flat shape of reflector 3130. In a preferred embodiment, reflector surfaces 3128a and 3128b have optical prescriptive surfaces for selectively reflecting and redirecting incoming image rays as described in Table IV. Alternatively, the prescription is the same for both surfaces 3128a and 3128b.

The three-reflection configuration of FIG. 7 has various advantages over the above two-reflection embodiments of at least FIGS. 1 and 3 above, including, for example, substantially decreased collector body thickness, decreased system thickness, increased lens efficiency and minimal chromatic smear. The embodiment of FIG. 7 uses a combination of a shaped or contoured reflector with a planar reflector to create optical memory 3100 which is preferred for many applications. This configuration, like the configuration of FIGS. 5 and 6, is also somewhat less expensive to fabricate than the memory 100' of FIGS. 3 and 4 because only one of the reflective surfaces needs contouring. Furthermore, the higher cost optics are again in the collector module 3120 which serves as the reader or drive, and the less costly (to manufacture) diffractive elements are in the card 3104 which has the higher volume sales and hence production and is more cost sensitive on a per unit basis.

The embodiment of FIG. 7 is shown in the form of optical memory 3100 that uses a contoured reflector 3128 in combination with a planar reflector surface 3130 which, as noted, is preferred for economical manufacture. Memory device 3100 in accordance with the invention is shown to include a data/lens cartridge or card 3104, sensor array 3108, and array of light sources 3106. Interface electronics (not shown here) control the selective illumination of light sources 3106 and the retrieval of data from sensor array 3108. Such electronics are fully disclosed in above incorporated references: U.S. Pat. Nos. 5,379,266 and 5,436,871, U.S. patent application Ser. No. 08/920,847 and published international application PCT/US97/07967.

The principal components of the memory 3100 shown in FIG. 7 are mounted in a suitable housing (not shown here but such as disclosed in above incorporated U.S. Pat. No. 5,436,871) to fix the relative positions of light sources and the reflection and sensor components. A slot may thus be provided in a housing between the light sources 3106 and an image collector module that contains the image folding optics for receiving insertion of removable data/lens card 3104. As described in connection with card 104 of FIG. 2, above, card 3104 includes an annular array of data 190 pages or patches, for selective illumination by light sources 3106. One patch of data is illuminated at a time so that only that data is imaged onto the sensor 3108. When card 3104 is inserted into the reader, data 190 are in registration with a correspondingly shaped annular array of page selection light sources 3106 supported by the device housing.

In a preferred embodiment, a diffractive transmissive grating 220 tilts the illumination rays inwardly upon exiting light sources 3106 which redirects the light from sources 3106 from a normal exit path as best indicated in FIG. 4 and described in detail above. As described above in connection with card or cartridge 104' in FIG. 4, cartridge 3104 includes at least a first diffractive lens array surface 3210 embedded in the cartridge 3104 so that registration of the surface is fixed relative to the data layer 3190 and is radially offset in alignment with the light path of the tilted illumination rays emerging from diffractive grating 220. In a preferred embodiment, card 3104 includes at least first and second diffractive lens array surfaces 3210a and 3210b, forming a two surface lens system embedded in the cartridge 3104 so that registration of both of the two surfaces are fixed relative to the data layer 3190 and are radially offset in alignment with the light path of the tilted illumination rays emerging from diffractive grating 220. In FIG. 7, as in FIGS. 3, 4, 5 and 6, diffractive transmissive grating 220 operates with data layer 3190 and radially offset first and second lens surfaces 3210a and 3210b to redirect the image rays emerging from cartridge 3104 onto an inwardly angled path toward the center of the assembly so that the image folding optics module 3120 has less requirement to act as a collector lens in successive reflections off of surfaces 3128 and 3130 bringing the image to the centered sensor array 3108. As described above in connection with FIGS. 3 and 4, the grating 220 is fabricated at the exit surface of light sources 3106 and is in an annular pattern varying in markings with radius so that the illuminating rays 222 from selected light sources 106a' are shifted to angle inwardly along the centerline of the optical axes created by the offset data 3190, and first and second lenslet surfaces 3210a and 3210b. Thus the first and second lenslet surfaces 3210a and 3210b are fully illuminated with the data rays. In operation, as a data page is selected by illumination from light sources 3106, the illumination rays are tilted by grating 220, the tipped image rays of the illuminated data page are passed through first and second diffractive lenslets in lens surfaces 3210a and 3210b of card 3104.

The altered image rays that exit the cartridge enter the collector optics 3120 through an annular transparent window 3132 of optical collector body 3122 on a first path 3140 which intercepts outer annular portion 3128a of the mirrored reflector surface 3128 at a strike angle as shown. The concave outer annular portion 3128a of contour reflector surface 3128 provides the field collection effect needed to redirect the image rays radially inwardly and downwardly of the device on a second path 3142 toward a zero or flat shaped annular mirrored surface 3130 centered co-axially with the axis of collector body 3122 and positioned on the face of optical collector body 3122 proximate the plane of the cartridge slot where a second reflection occurs. Annular mirrored surface 3130 reflects the image rays upwardly and further inwardly on a third path 3144 toward a central concave portion of contour reflector surface 3128b where a further field collection effect provides a third reflection which redirects the image rays downwardly and radially inwardly on a fourth path 3146 toward the center exit window 3125 positioned central of annular planar mirrored surface 3130 in the face of optical collector body 3122 and proximate data cartridge 3104 in a plane parallel to the upper face of card 3104, i.e., above the card receiving slot. In a preferred embodiment, exit window 3125 is co-planar with annular ring reflector 3130. The detector or sensor array 3108 is behind an exit window 3125 in the center of the annular reflector 3130 and positioned proximate the cartridge 3104 opposite the image folding optics module or collector optics 3120.

Collector module body 3122 is made of a suitably transparent material such as glass or plastic and has a diameter about matching that of the outer circumference of the annular array of data 3190. The thickness of body 3122 along the center line of the optical axis depends on the extent of the triple folded optical path as described herein but in general is significantly less than that in the two-reflection embodiments shown in FIGS. 1 through 4, above. Contoured reflector surface 3128 is on the distal side of collector body 3122 from the data/lens card 3104 and occupies essentially the entire region inwardly offset from the outermost circumference of image folding optics module 3120. Annular planar reflector surface 3130 occupies an annular region in a central area of the surface of the disk-shaped body 3122 inwardly of an annular entry window 3132 and terminating at a central area of the collector body 3122 reserved for an exit window 3125 of the image folding optics module 3120. Annular reflector surface 3130 is co-axial with contoured reflector surface 3128 and is positioned on an opposing surface of collector body 3122 lying in a plane parallel to and near the upper face of card 3104, i.e., above the card receiving slot.

Sensor array 3108 in this embodiment is located proximate data card 3104 opposite image folding optics module 3120 at the exit window 3125. Sensor array 3108 is preferably located co-axially with the exit window 3125 and centrally of annular light source array 3106. As in the two-reflection embodiments described above, to accommodate this format, sensor array 3108 is preferably a square with the corners lopped off to fit within the inside concentric area in the center of the annular light source array 3106. The sensor thus is roughly a circle or many sided polygon. The active area of sensor array 3108 is somewhat greater than the projected image size for the reasons described in detail above. The chip or substrate on which the sensor is mounted is fixed in the device housing at the center of annular light source array 3106 opposite the image folding optics module 3120 to effectively eliminate any thickness increment due to the sensor array 3108. In a preferred embodiment, sensor array 3108 is co-planar with light source array 3106 and is preferably co-located with light source array 3106 on a single multifunction substrate. The preferred structure of sensor array 3108 is described in detail above in connection with sensor array 108.

The system configuration of FIG. 7 substantially shrinks the device thickness, producing a reduction sufficient to allow a data chapter of about 40 mm diameter to be used in a system with an optical thickness (excluding housing structure) of less than 10 mm bringing the device into a size suitable for a small notebook-type computer. In this three-reflection embodiment, as with the two-reflection embodiments described above, the inner radius of the annular array of data 3190 cannot be less than the maximum radius of the second reflection. That is, the reflector for the planar reflector 3130 would prevent light coming through from patches at a smaller radius. As in the two-reflection embodiments, the optical magnification is held constant at about 20. There are practical reasons for this magnification related to the size of the sensor array and the effective diameter of the data page as discussed in detail above.

The various lens and reflective surfaces are again computed for optimum prescription using the OSLO6 commercial lens design program. The applicable prescriptions for the embodiment of FIG. 7 are set forth in Table IV and contain the values and materials for construction of this embodiment. The prescriptions for the various surfaces are read as indicated above for the previously discussed table and include the tilt and decenter specifications.

TABLE IV

Example of prescriptions/materials

*Lens Data for FIG. 7
Three Reflection System

| SRF | RADIUS | THICKNESS | APERTURE RADIUS | GLASS | SPE | NOTE |
|---|---|---|---|---|---|---|
| OBJ | — | 0.100000 | 0.241400 | ULTEM | C | Data plans |
| 1 | — | 0.900052 V | 0.251400 | ULTEM | P * | Spacer |
| 2 | — | 1.100741 V | 0.251400 PK | ACRYLIC | C * | 1st Lens |
| AST | — | 0.250000 | 0.251400 APK | AIR | * | 2d Lens |
| 4 | — | 7.409048 V | 17.500000 | ULTEM | C * | Offset |
| 5 | −319.539318 V | −7.409048 P | 17.500000 P | REFLECT | * | |
| 6 | — | 7.409048 P | 18.000000 | REFLECT | | |
| 7 | −319.539318 P | −7.409048 P | 18.000000 P | REFLECT | * | |
| 8 | — | −0.250000 | 6.000000 | AIR | | |
| 9 | — | −1.900000 | 18.000000 P | POLYC | C | |
| 10 | — | −0.100000 | 4.600000 | AIR | | Elastomer |
| IMS | — | — | 4.600000 P | | | Detector Array |

*CONIC AND POLYNOMINAL ASPHERIC DATA

| SRF | CC | AD | AE | AF | AG |
|---|---|---|---|---|---|
| 5 | 328.272424 | — | — | — | — |
| 7 | 328.272424 | — | — | — | — |

*DIFFRACTIVE SURFACE DATA

| 2 | DOE DFX | 8 - | ASYMMETRIC | DIFFRACTIVE | SRF | DOR 1 | DWV 0.596000 |
|---|---|---|---|---|---|---|---|
| | | | | | | KCO 1 | KDP — |
| | DF2 | −0.137551 | DF3 | −0.456567 | DF5 | −0.421100 | DF7 −0.134944 |
| | DF9 | −0.079136 | DF10 | 0.127785 | DF12 | 0.099417 | DF14 0.112281 |
| | DF16 | −0.324457 | DF20 | −0.171803 | DF27 | −0.165439 | DF33 −4.077649 |
| 3 | DOE DFX | 10 - | ASYMMETRIC | DIFFRACTIVE | SRF | DOR 1 | DWV 0.596000 |
| | | | | | | KCO 1 | KDP — |
| | DF2 | 0.026426 | DF3 | −0.250194 | DF5 | −0.159812 | DF7 0.162294 |
| | DF9 | 0.138504 | DF10 | 0.091300 | DF12 | 0.090927 | DF14 0.076916 |
| | DF16 | 0.022517 | DF18 | 0.033689 | DF20 | 0.042674 | DF27 −0.129922 |

*REFRACTIVE INDICES

| SRF | GLASS | RN1 | RN2 | RN3 | VNBR | TCE |
|---|---|---|---|---|---|---|
| 0 | ULTEM | 1.658417 | 1.660132 | 1.656759 | 195.199775 | — |
| 1 | ULTEM | 1.658417 | 1.660132 | 1.656759 | 195.199775 | — |
| 2 | ACRYLIC | 1.490755 | 1.491264 | 1.490263 | 490.384716 | — |
| 3 | AIR | 1.000000 | 1.000000 | 1.000000 | — | 236.000000 |
| 4 | ULTEM | 1.658417 | 1.660132 | 1.656759 | 195.199775 | — |
| 5 | REFLECT | 1.658417 | 1.660132 | 1.656759 | 195.199775 | 62.000000 |
| 6 | REFLECT | 1.658417 | 1.660132 | 1.656759 | 195.199775 | 62.000000 |

TABLE IV-continued

Example of prescriptions/materials

| 7  | REFLECT       | 1.658417 | 1.660132 | 1.656759 | 195.199775 | —          |
|----|---------------|----------|----------|----------|------------|------------|
| 8  | AIR           | 1.000000 | 1.000000 | 1.000000 | —          | 236.000000 |
| 9  | POLYC         | 1.585323 | 1.586133 | 1.584541 | 367.616162 | —          |
| 10 | AIR           | 1.000000 | 1.000000 | 1.000000 | —          | 236.000000 |
| 11 | IMAGE SURFACE |          |          |          |            |            |

While only particular embodiments have been disclosed herein, it will be readily apparent to persons skilled in the art that numerous changes and modifications can be made thereto, including the use of equivalent means, devices, and method steps without departing from the spirit of the invention.

I claim:

1. A collector for retrieving optical data from a record having different data regions illuminated by selectable light sources, the collector comprising:

a sensor having an array of light sensing elements arranged at a common image surface disposed at a predetermined optical path distance from the record for sensing data from light in an image of data from the illuminated record; and an optical imaging system having a plurality of optical reflective surfaces disposed in substantially opposing relationship, said optical imaging system disposed in said optical path between the record and said sensor and fixed in an opposing relationship to said sensor relative to the record.

2. The optical data system of claim 1, wherein said plurality of optical reflective surfaces are configured in said optical path to cause three reflections of data image rays.

3. The optical data system of claim 2, wherein at least one of said plurality of optical reflective surfaces is formed with a contoured mirror.

4. The optical data system of claim 3, wherein said optical reflective surface formed with a contoured mirror has an optical prescription that includes a combination of spherical and aspherical attributes.

5. The optical data system of claim 4, wherein one of said reflective optical surfaces is proximate the record, and said sensor array is substantially co-axial with said optical imaging system and proximate to the record opposite said optical imaging system.

6. An optical data system comprising:

an optical data object storing data as light altering characteristics;

a controllable light source for selectively illuminating different data regions of said optical data object;

a data imaging lens system having at least a first surface arranged in such proximity to and in optical registration with said data regions on said optical data object such that an image resolving power of said data imaging lens is substantially uniform over the field of view of each said data region;

a sensor having an array of juxtaposed light sensing elements arranged at a common image surface disposed at a predetermined optical path distance from said object for sensing data from light in an image of said data corresponding to one of said selectively illuminated data regions;

a plurality of optical reflective surfaces disposed at a predetermined distance from a side of said object opposite said sensor and in an optical path between said data imaging lens and said common image surface for multiple reflection and redirection of said image of data onto said sensor at said common image surface; and a data output circuit coupled to said sensor for outputting signals representative of said data.

7. The optical data system of claim 6, wherein at least one of said plurality of optical reflective surfaces is formed with a contoured mirror.

8. The optical data system of claim 7, wherein said plurality of optical reflective surfaces are configured in said optical path to cause three reflections of data image rays.

9. An optical data system comprising:

an optical data object storing data as light altering characteristics in a plurality of data regions;

a controllable light source for selectively illuminating different ones of said data regions;

a data imaging lens arranged in such proximity to and in optical registration with said data regions such that an image resolving power of said data imaging lens is substantially uniform over the field of view of each said data region;

a sensor having an array of juxtaposed light sensing elements arranged at a common image surface disposed at a predetermined distance from said optical data object for sensing data from light in an image of said data corresponding to one of said selectively illuminated data regions;

an image collector including first and second reflective optical surfaces disposed in substantially opposing relation to an optical path between said data imaging lens and said common image surface for multiple reflection and redirection of said image of data onto said sensor at said common image surface; and data signal output means coupled to said sensor for outputting data signals representing said data of an illuminated and imaged data region.

10. The optical data system of claim 9, said first reflective optical surface further comprising:

an annular reflective optical surface comprising an optical prescription for selectively redirecting data image bits within each data region onto said second reflective optical surface; and an inner reflective optical surface positioned central of said annular reflective optical surface, said inner reflective optical surface comprising an optical prescription for selectively redirecting said data image bits reflected from said second reflective optical surface onto said common image surface.

11. The optical data system of claim 10, wherein said prescription of said annular reflective optical surface is different from said prescription of said inner reflective optical surface.

12. The optical data system of claim 10, wherein said first reflective optical surface has a non-planar contour to provide each said prescription.

13. The optical data system of claim 9, wherein said first reflective optical surface has an optical prescription that includes a combination of spherical and aspherical attributes.

14. The optical data system of claim 9, wherein said second reflective optical surface is substantially parallel with and spaced away from said data object, and said sensor array is substantially co-axial with said image collector and substantially parallel with and spaced away from said data object opposite said image collector.

15. The optical data system of claim 9, wherein said data regions are arrayed in an annular planar pattern on said optical data object that defines a center open region, and wherein said optical data object is removably disposed relative to said light source and said image collector so that said second reflective optical surface is located in a plane generally parallel to said data regions in substantial registration with said center of said optical data object.

16. The optical data system of claim 9, further comprising at least a first diffractive surface interposed between said light source and said data object to tilt rays that form the data image radially inwardly toward a center of the system.

17. The optical data system of claim 9, wherein said first and second reflective optical surfaces are configured to cause the image rays to reflect at least thrice before striking said sensor array.

18. The optical data system of claim 9, wherein:

said optical data object comprises a data layer for storing said data and at least a first imaging lens surface fixed in a cartridge;

said first and second reflective surfaces are disposed on an optically transparent collector positioned in facing relation to said cartridge; and said sensor array is disposed substantially co-axially with said image collector and opposite said cartridge.

19. A method for retrieving data from an optical data object having data stored in different data regions as light altering characteristics, the method comprising the steps of:

selectively illuminating different data regions of the optical data object;

projecting data image bits within each data region onto a common surface of an image collector;

multiply reflecting and redirecting said data image bits within said image collector;

disposing a sensor at a predetermined distance from the optical data object, said sensor having an array of light sensing elements arranged at a common image surface;

intercepting said reflected and redirected data image bits on said common image surface of said sensor;

sensing data from light in an image of said data image bits corresponding to one of the selectively illuminated data regions;

converting said sensed data into data signals representing said data image bits; and outputting said data signals.

20. The method of claim 19, wherein said multiply reflecting and redirecting step includes the steps of:

intercepting said projected data image bits at an annular portion of a reflective optical surface comprising an optical prescription for selectively redirecting said data image bits within each data region downwardly and radially inwardly toward an opposing reflective optical surface;

reflecting and redirecting said data image bits upwardly and radially inwardly toward a reflective surface inner of said annular portion; and reflecting and redirecting said data image bits downwardly and radially inwardly toward said common image surface of said sensor.

* * * * *